United States Patent
Lee et al.

(10) Patent No.: US 10,290,335 B2
(45) Date of Patent: May 14, 2019

(54) SEMICONDUCTOR DEVICE WITH CURRENT PATH CONTROL UNIT FOR DECREASING THE LEVEL OF A VOLTAGE

(71) Applicant: SK hynix Inc., Icheon-si, Gyeonggi-do (KR)

(72) Inventors: Sung Yub Lee, Icheon-si Gyeonggi-do (KR); Sung Soo Chi, Yongin-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/493,803

(22) Filed: Apr. 21, 2017

(65) Prior Publication Data
US 2018/0033473 A1    Feb. 1, 2018

(30) Foreign Application Priority Data

Jul. 28, 2016    (KR) .................. 10-2016-0096236

(51) Int. Cl.
*G11C 8/08* (2006.01)
*G11C 5/14* (2006.01)
*G11C 8/14* (2006.01)

(52) U.S. Cl.
CPC .................. *G11C 8/08* (2013.01); *G11C 5/14* (2013.01); *G11C 8/14* (2013.01)

(58) Field of Classification Search
CPC ................ G11C 8/08; G11C 5/14; G11C 7/12
See application file for complete search history.

(56) References Cited

U.S. PATENT DOCUMENTS

| | | | | |
|---|---|---|---|---|
| 6,356,488 B1 * | 3/2002 | Kang | ..................... | G11C 16/30 365/185.23 |
| 2004/0212014 A1 * | 10/2004 | Fujito | .................. | G11C 7/1051 257/355 |
| 2008/0123463 A1 * | 5/2008 | Matsubara | ............... | G11C 8/08 365/230.06 |
| 2009/0116305 A1 * | 5/2009 | Son | ......................... | G11C 8/08 365/189.09 |
| 2015/0235685 A1 | 8/2015 | Park et al. | | |

FOREIGN PATENT DOCUMENTS

KR    1020100128642 A    12/2010

\* cited by examiner

*Primary Examiner* — Jerome Leboeuf
(74) *Attorney, Agent, or Firm* — William Park & Associates Ltd.

(57) ABSTRACT

The semiconductor device may include a driving voltage supply unit configured to supply a voltage such that a main word line signal has the voltage. The semiconductor device may include a current path control unit configured to increase the speed at which the voltage of the main word line signal decreases.

19 Claims, 6 Drawing Sheets

SEMICONDUCTOR DEVICE WITH CURRENT PATH CONTROL UNIT FOR DECREASING THE LEVEL OF A VOLTAGE

CROSS-REFERENCES TO RELATED APPLICATION

The present application claims priority under 35 U.S.C. § 119(a) to Korean application number 10-2016-0096236, filed on Jul. 28, 2016, in the Korean Intellectual Property Office, which is incorporated herein by reference in its entirety.

BACKGROUND

1. Technical Field

Various embodiments may generally relate to a semiconductor device, and more particularly, to a circuit for driving a word line.

2. Related Art

FIG. 1 is a diagram illustrating the structure of a conventional memory cell array.

Referring to FIG. 1, the memory cell array consists of a plurality of memory cells 11 to 16, a plurality of word lines WL_X−1, WL_X and WL_X+1 and a plurality of bit lines BL_Y and BL_Y+1. The plurality of memory cells 11 to 16 are positioned at the respective intersections between the plurality of word lines WL_X−1, WL_X and WL_X+1 and the plurality of bit lines BL_Y and BL_Y+1. The plurality of memory cells 11 to 16 consist of capacitors C1 to C6 for storing data and transistors T1 to T6 for controlling coupling between the capacitors C1 to C6 and the bit lines BL_Y and BL_Y+1, respectively.

Such a memory cell array is operated as follows.

During an active operation, when at least one of the plurality of word lines WL_X−1, WL_X and WL_X+1, for example, the word line WL_X is selected and enabled, the transistors T3 and T4 of the memory cells 13 and 14 coupled to the enabled word line WL_X are turned on. Thus, data stored in the capacitors C3 and C4 of the memory cells 13 and 14 are transmitted to the bit lines BL_Y and BL_Y+1, respectively.

The data transmitted to the bit lines BL_Y and BL_Y+1 are sensed and amplified by bit line sense amplifiers (not illustrated). During a read operation, when at least one bit line, for example, the bit line BL_Y is selected, data of the bit line sense amplifier corresponding to the bit line BL_Y are outputted.

A circuit for selecting and enabling one or more of the plurality of word lines WL_X−1, WL_X and WL_X+1 is referred to as a word line driving circuit. At this time, a relatively large voltage is applied to enable the word line. Thus, stress may be applied to components constituting the word line driving circuit.

SUMMARY

In an embodiment of the present disclosure, a system may be provided. The system may include a semiconductor device. The system may include a current path control unit. In an embodiment of the present disclosure, a semiconductor device may be provided. The semiconductor device may include a driving voltage supply unit configured to supply a voltage such that a main word line signal has the voltage. The semiconductor device may include a current path control unit configured to increase the speed at which the voltage of the main word line signal decreases.

In an embodiment of the present disclosure, a semiconductor device may include: a driving voltage supply unit configured to selectively supply a first or second voltage based on a driving voltage select signal, such that a main word line signal has the voltage level of the first voltage or the second voltage lower than the first voltage; and a current path control unit configured to provide a path of a current for increasing the speed at which the voltage level of the main word line signal decreases from the level of the first voltage to the level of the second voltage after the driving voltage select signal is activated.

The semiconductor device may further include a main word line signal generation unit configured to generate the main word line signal by pull-up or pull-down driving a main word line driving signal, wherein the driving voltage supply unit supplies the first or second voltage as a pull-up driving voltage of the main word line signal generation unit.

The current path control unit may be coupled to a pull-up driving voltage supply terminal of the driving voltage supply unit.

The current path control unit may be controlled according to a current path control signal which is activated for a predetermined time from a point of time that the driving voltage select signal is activated, and include a MOS transistor which is controlled according to the current path control signal, wherein when the current path control signal is activated, a current flows to the current path control unit through a pull-up driving unit of the main word line signal generation unit from an output terminal of the main word line generation unit.

The MOS transistor may include an NMOS transistor, and the current path control signal may be generated by performing an XOR operation on the driving voltage select signal and a signal obtained by delaying the driving voltage select signal by a predetermined time.

The current path control signal may be activated to a high level for the predetermined time from a point of time that the driving voltage select signal is activated.

The MOS transistor may include a PMOS transistor including a source of the PMOS transistor configured to receive the first or second voltage from the driving voltage supply unit, including a gate of the PMOS transistor configured to receive the current path control signal, and including a drain of the PMOS transistor configured to receive a supply voltage or a ground voltage.

The driving voltage select signal may be activated while the main word line signal is at a low level.

The driving voltage supply unit may be configured to selectively supply the first or the second voltage based on the driving voltage select signal and a normal signal, and the normal signal and the driving voltage select signal have an inversion relation.

DETAILED DESCRIPTION

Hereinafter, a semiconductor device according to the present disclosure will be described below with reference to the accompanying drawings through examples of embodiments.

Various embodiments may be directed to a word line driving circuit capable of controlling a driving voltage to lower a voltage applied to an element.

Figure 2:
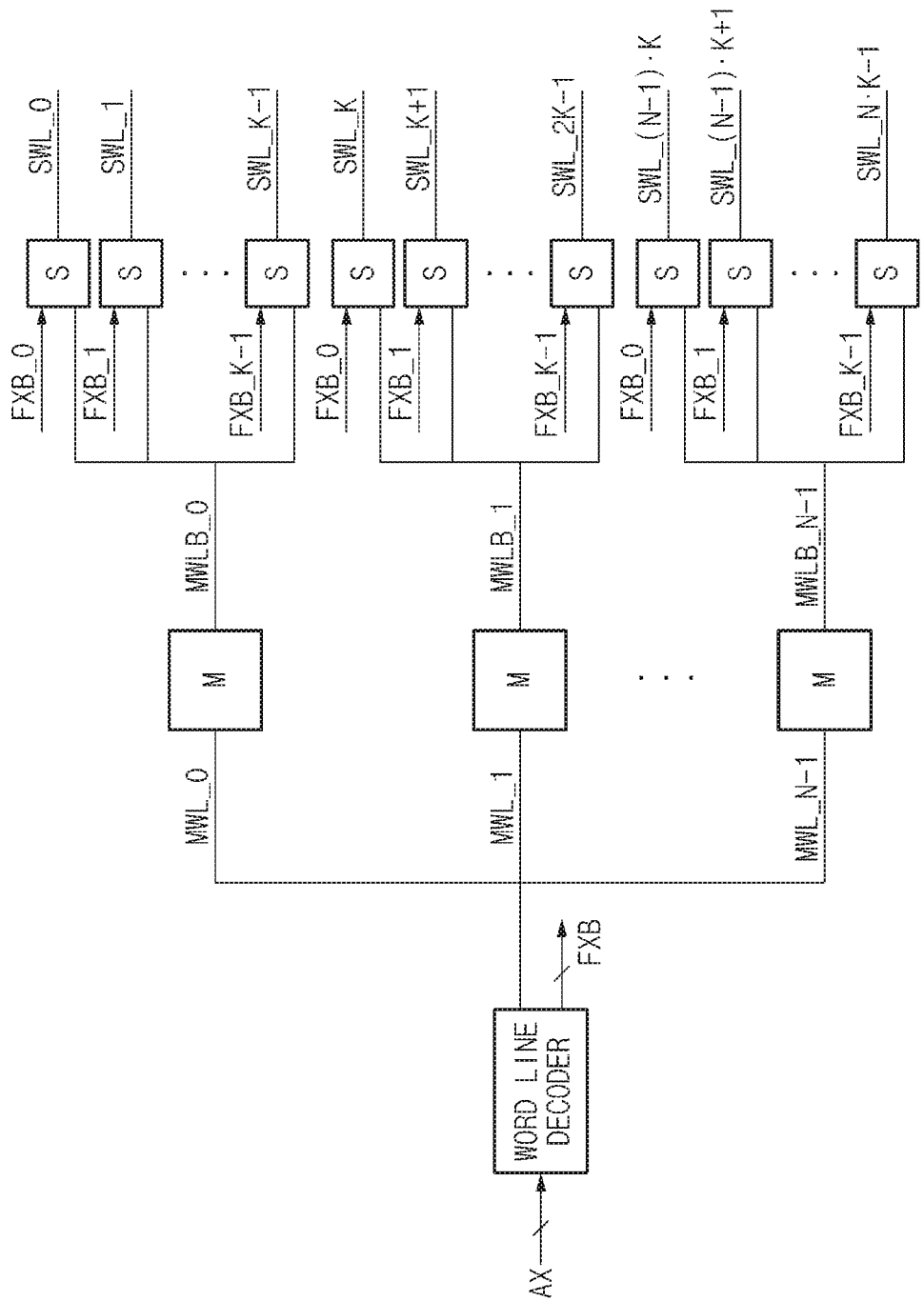
FIG. 2 is a configuration diagram of a semiconductor device according to an embodiment.

FIG. 2 is a configuration diagram of a semiconductor device according to an embodiment.

Referring to FIG. 2, the semiconductor device may include a word line decoder 20, a plurality of main word line drivers M and a plurality of sub word line drivers S.

The word line decoder 20 may decode an input address AX having a plurality of bits, and generates N main word line driving signals MWL and K sub word line driving signal FXB.

For example, the input address AX may have 12 bits. The word line decoder 20 may decode upper nine bits of the 12-bit input address AX, and generate 512 main word line driving signals MWL_0 to MWL_511. At this time, N may be set to 512. The 512 main word line driving signals MWL0 to MWL511 may be inputted to the corresponding main word line drivers M.

The word line decoder 20 may decode lower three bits of the 12-bit input address AX, and generate 8 sub word line driving signals FXB_0 to FXB_7. At this time, K may be set to 8.

Each of the main word line drivers M may generate a main word line signal MWLB from the main word line driving signal MWL.

The number of main word line drivers M may correspond to the number of main word line driving signals MWL, that is, N. When the number of main word line driving signals MWL is 512 as in the above-described example, 512 main word line drivers M may be installed. The main word line drivers M may generate main word line signals MWLB_0 to MWLB_511 from the main word line driving signals MWL_0 to MWL_511, respectively.

Figure 1:
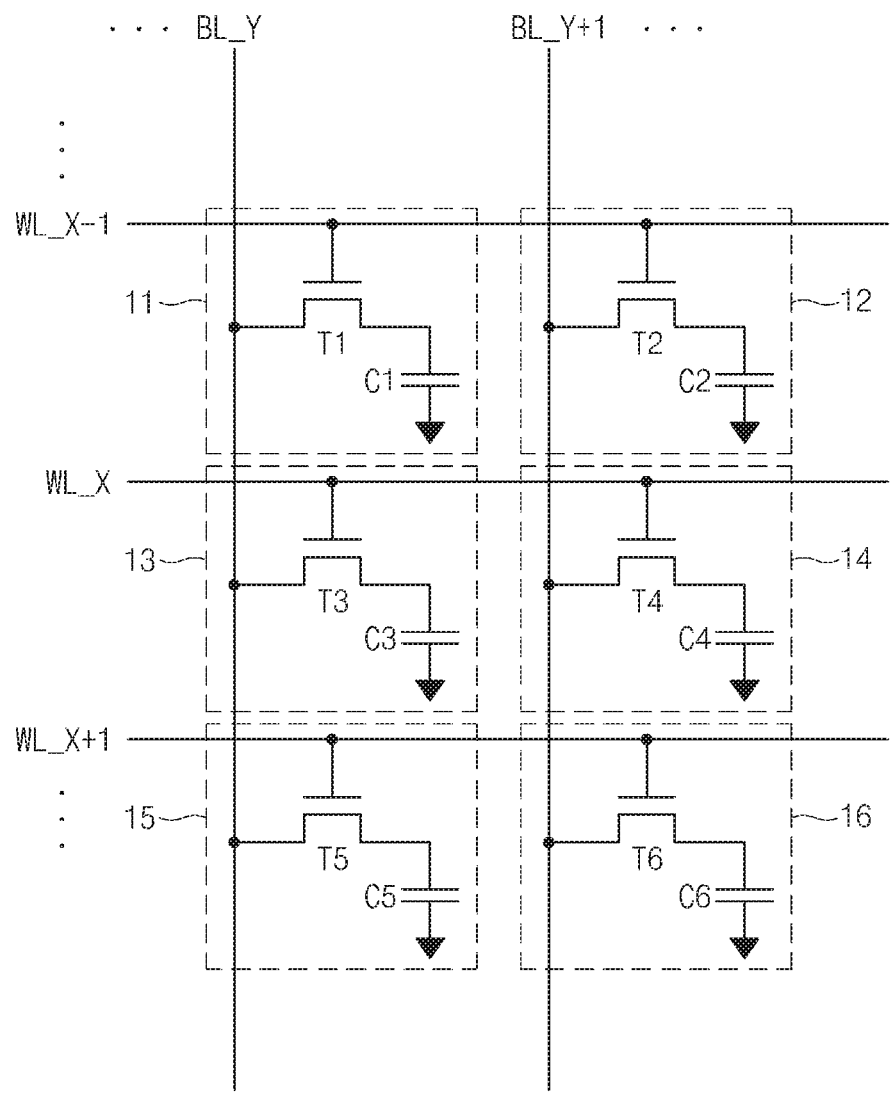
FIG. 1 is a configuration diagram of a conventional memory cell array.

Each of the sub word line drivers S may select a sub word line SWL based on the main word line signal MWLB and the sub word line driving signal FXB outputted from the word line decoder 20. In an embodiment, the sub word line SWL may, for example but not limited to, correspond to a word line WL of FIG. 1.

Each of the main word line drivers M may be coupled to K sub word line drivers S corresponding to the number of sub word line driving signals. In the above-described example, each of the 512 main word line drivers M may be coupled to eight sub word line drivers S.

The K sub word line drivers S coupled to each of the main word line drivers M may commonly receive the main word line signal MWLB outputted from the main word line driver M. Furthermore, the K sub word line drivers S may receive K sub word line driving signals FXB from the word line decoder 20, respectively.

In the above-described example, the eight sub word line drivers S coupled to the main word line driving signal MWL_0 may receive the sub word line driving signals FXB_0 to FXB_7, respectively, and the eight sub word line drivers S coupled to the main word line driving signal MWL_1 may receive the sub word line driving signals FXB_0 to FXB_7, respectively.

In other words, the semiconductor device according to a present embodiment may have a configuration in which each of the N main word line drivers M is coupled to K sub word line drivers S. Thus, the semiconductor device may select one or more sub word lines SWL among a total of N*S sub word lines SWL, based on the input address AX containing a plurality of bits.

In the above-described example, the number of bits contained in the input address AX was set to 12, N was set to 512, and K was set to 8. However, the present embodiments are not limited thereto. For example, N may be set to 256, and K may be set to 16. In this case, the number of sub word line drivers S may be set to the same value of 4,096, and the number of main word line drivers M may decrease. However, the number of wirings connecting the main word line driver M to the sub word line drivers S and the number of wirings connecting the word line decoder 20 to the sub word line drivers S may increase. For another example, N may be set to 1,024, and K may be set to 4. In this case, the number of wirings connecting the main word line driver M to the sub word line drivers S and the number of wirings connecting the word line decoder 20 to the sub word line drivers S may decrease. However, the number of main word line drivers M may increase. Thus, the number of main word line drivers M and the number of sub word line drivers S may be properly set in consideration of the number of drivers and the wirings.

Figure 3:
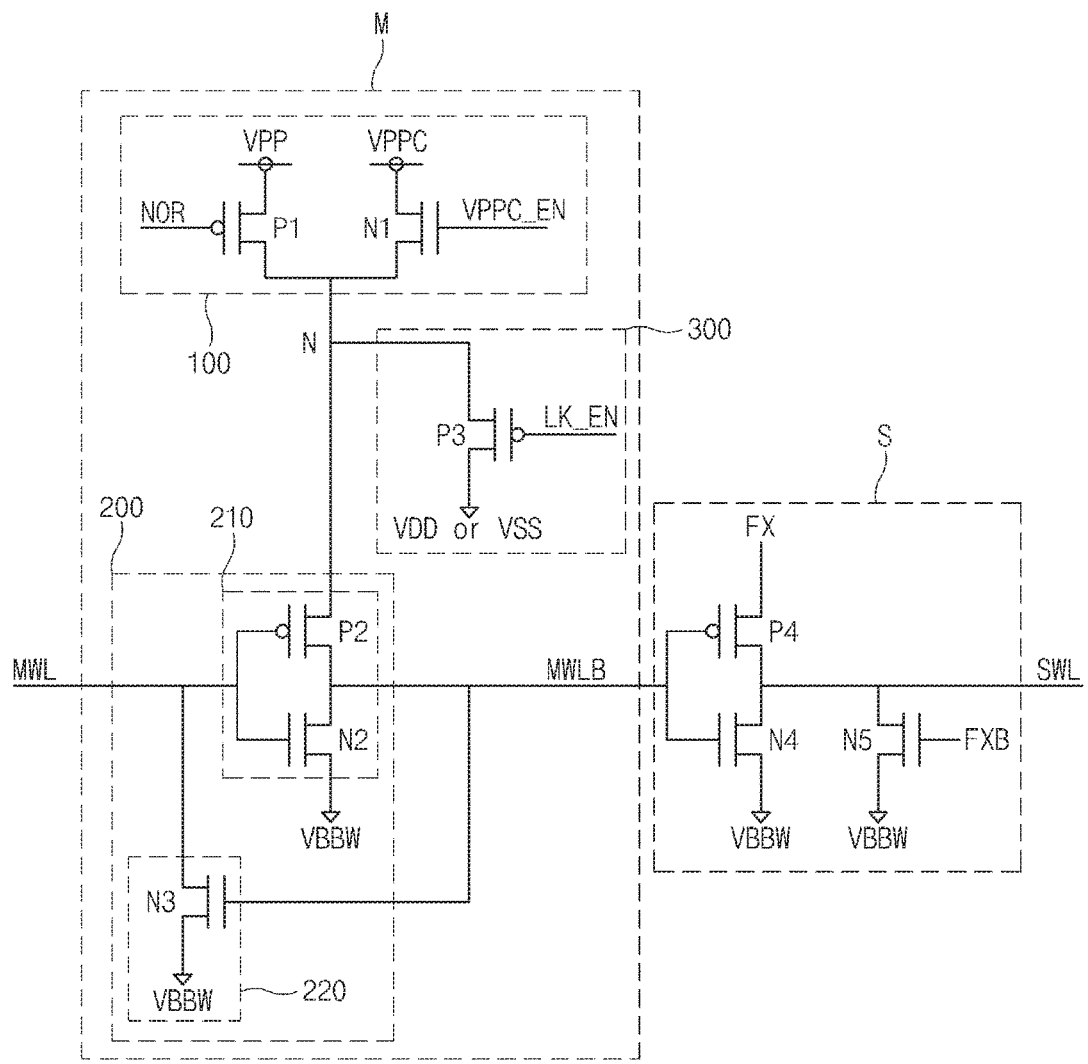
FIG. 3 is a circuit diagram of a main word line driver and a sub word line driver of FIG. 2.

FIG. 3 is a circuit diagram of the main word line driver M and the sub word line driver S in FIG. 2.

The main word line driver M and the sub word line driver S of FIG. 3 may represent a main word line driver M and a sub word line drivers S which are coupled to each other in FIG. 2. FIG. 3 omits numbers indicating the order of the main word line driving signal MWL, the main word line signal MWLB and the sub word line driving signal FXB.

Hereafter, referring to FIG. 3, the main word line driver M and the sub word line driver S will be sequentially described.

The main word line driver M may include a driving voltage supply unit 100, a main word line signal generation unit 200 and a leaker unit (current path control unit) 300.

The driving voltage supply unit 100 may include a PMOS transistor P1 and an NMOS transistor N1. The PMOS transistor P1 may supply a pumping voltage (first voltage) VPP as a driving voltage of the main word line signal generation unit 200, and the NMOS transistor N1 may supply an internal voltage (second voltage) VPPC as the driving voltage of the main word line signal generation unit 200.

The PMOS transistor P1 may receive a normal signal NOR through the gate thereof, receive the pumping voltage through the source thereof, and have the drain coupled to the main word line signal generation unit 200.

According to such a configuration, when the normal signal NOR is activated to a low level, the PMOS transistor P1 may be turned on, and the voltage of the drain of the PMOS transistor P1, that is, a node N may be changed to the pumping voltage VPP. The pumping voltage VPP may be supplied as the driving voltage of the main word line signal generation unit 200.

The NMOS transistor N1 may receive a driving voltage select signal VPPC_EN through the gate thereof, and receive the pumping voltage through the drain thereof, and have the source coupled to the main word line signal generation unit 200.

According to such a configuration, when the driving voltage select signal VPPC_EN is activated to a high level, the NMOS transistor N1 may be turned on. At this time, a threshold voltage Vth may be applied between the drain and source of the NMOS transistor N1, unlike the PMOS transistor P1. Thus, the voltage of the source of the NMOS transistor N1, that is, the node N may be changed to an internal voltage VPPC smaller by the threshold voltage Vth than the pumping voltage VPP. The internal voltage VPPC may be supplied as the driving voltage of the main word line signal generation unit 200.

That is, the NMOS transistor N1 may generate a voltage lower than the pumping voltage VPP using its own characteristic. However, present embodiments are not limited thereto, but another method of generating a voltage lower than the pumping voltage VPP, for example, a method of dividing a voltage using a plurality of resistors may be used.

In the above-described example, the normal signal NOR and the driving voltage select signal VPPC_EN are separately applied to the driving voltage supply unit 100. However, present embodiments are not limited thereto, but the normal signal NOR and the driving voltage select signal VPPC_EN may have an inversion relation. That is, when the driving voltage select signal VPPC_EN is activated, the normal signal NOR may be deactivated, and when the driving voltage select signal VPPC_EN is deactivated, the normal signal NOR may be activated.

Through the driving voltage supply unit 100, the pumping voltage VPP or the internal voltage VPPC may be selectively supplied as the driving voltage of the main word line signal generation unit 200.

The main word line signal generation unit 200 may include an inversion unit 210 and a latch unit 220.

The inversion unit 210 may include a PMOS transistor P2 and an NMOS transistor N2 which are coupled in series to each other. The PMOS transistor P2 and the NMOS transistor N2 may receive the main word line driving signal MWL through the gates thereof in common. The drain of the PMOS transistor P2 and the drain of the NMOS transistor N2 may be coupled to each other, and serve as an output terminal of the main word line signal MWLB. The internal voltage VPPC or the pumping voltage VPP generated from the driving voltage supply unit 100 may be supplied as the driving voltage to the source of the PMOS transistor P2, that is, the node N. Furthermore, a back bias voltage VBBW lower than a ground voltage VSS, for example, may be supplied to the source of the NMOS transistor N2.

According to such a configuration, the inversion unit 210 may generate the main word line signal MWLB by pull-up or pull-down driving the main word line driving signal MWL.

For example, when the main word line driving signal MWL is at a high level, the NMOS transistor N2 may be turned on. Thus, the low-level main word line signal MWLB may be outputted.

On the other hand, when the main word line driving signal MWL is at a low level, the PMOS transistor P2 may be turned on. Thus, the high-level main word line signal MWLB may be outputted.

That is, the inversion unit 210 may generate the main word line signal MWLB by pull-up or pull-down driving the main word line driving signal MWL, the main word line signal MWLB being an inverted signal of the main word line driving signal MWL.

The latch unit 220 may include an NMOS transistor N3. The NMOS transistor N3 may have the gate coupled to an output terminal of the inversion unit 210 and the drain of the NMOS transistor N3 coupled to an input terminal of the inversion unit 210, and receive the back bias voltage VBBW through the source thereof.

According to such a configuration, the latch unit 220 may retain the voltage level of the main word line signal MWLB. For example, when the main word line driving signal MWL is at a low level, the main word line signal MWLB may be changed to a high level by the inversion unit 210. Thus, the NMOS transistor N3 of the latch unit 220 may be turned on and pull-down driven. Therefore, the main word line driving signal MWL of the drain of the NMOS transistor N3, that is, the input terminal of the inversion unit 210 may be retained at a low level.

When the main word line driving signal MWL is at a high level, the main word line signal MWLB may be changed to a low level by the inversion unit 210. Thus, the NMOS transistor N3 of the latch unit 220 may be turned off, and have no influence on the voltage level of the main word line driving signal MWL of the input terminal of the inversion unit 210.

That is, when the main word line driving signal MWL is at a low level and the main word line signal MWLB is thus at a high level, the latch unit 220 may perform a latch function of stably retaining the voltage levels of the main word line driving signal MWL and the main word line signal MWLB. For example, the latch unit 220 can be omitted.

The leaker unit 300 may include a PMOS transistor P3. The source of the PMOS transistor P3 may be coupled to the output terminal of the driving voltage supply unit 100, that is, the node N. The PMOS transistor P3 may receive a supply voltage VDD or ground voltage VSS through the drain thereof. Present embodiments are not limited thereto, and the voltage of the node N, that is, a voltage lower than the pumping voltage VPP or the internal voltage VPPC may be supplied to the drain of the PMOS transistor P3. The PMOS transistor P3 may receive a leaker enable signal (current path control signal) LK_EN through the gate thereof.

According to such a configuration, the leaker unit 300 may provide a path through which charges are transferred when the voltage level of the main word line signal MLWB decreases from the pumping voltage VPP to the internal voltage VPPC, thereby increasing the speed at which the pumping voltage VPP falls to the internal voltage VPPC.

Referring to FIG. 3, when the driving voltage select signal VPPC_EN is deactivated, the driving voltage supply unit 100 may output the pumping voltage as the driving voltage of the main word line signal generation unit 200. In this case, when the main word line driving signal MWL is at a low level, the main word line driving signal MWL may be pull-up driven by the PMOS transistor P2 of the inversion unit 210, and change the main word line signal MWLB to a high level. At this time, the main word line signal MWLB may become the pumping voltage which is the driving voltage of the PMOS transistor P2.

As described later, however, the main word line signal MWLB may be applied to the gate of a PMOS transistor P4 of the sub word line driver S. Thus, the main word line signal MWLB corresponding to the level of the pumping voltage VPP may apply a large stress to the PMOS transistor P4.

In a present embodiment, in order to reduce the stress applied to the PMOS transistor P4, the internal voltage VPPC having a lower level than the pumping voltage VPP may be supplied as the driving voltage of the inversion unit 210, in response to the driving voltage select signal VPPC_EN. Therefore, when the main word line driving signal MWL is at a low level, the voltage level of the main word line driving signal MWL may decrease from the pumping voltage VPP to the internal voltage VPPC. That is, according to a present embodiment, the driving voltage select signal VPPC_EN may be activated to lower the voltage level of the main word line signal MWLB.

In this case, however, when the voltage of the main word line signal line MWLB drops, there is no path through charges will escape. Thus, the dropping speed of the voltage is not so high. The leaker unit 300 may serve as a path through which charges will escape.

For example, when the driving voltage select signal VPP_EN is activated while the main word line driving signal MWL is at a low level, the voltage level of the main word line signal line MWLB may gradually decrease from the pumping voltage VPP to the internal voltage VPPC lower than the pumping voltage VPP. At this time, the charge of the main word line signal MWLB may escape to the supply terminal of the supply voltage VDD or the ground voltage VSS through the leaker unit 300 via the PMOS transistor P2. That is, a current may leak through the leaker unit 300 via the PMOS transistor P2 from the main word line signal line MWLB.

Figure 4:
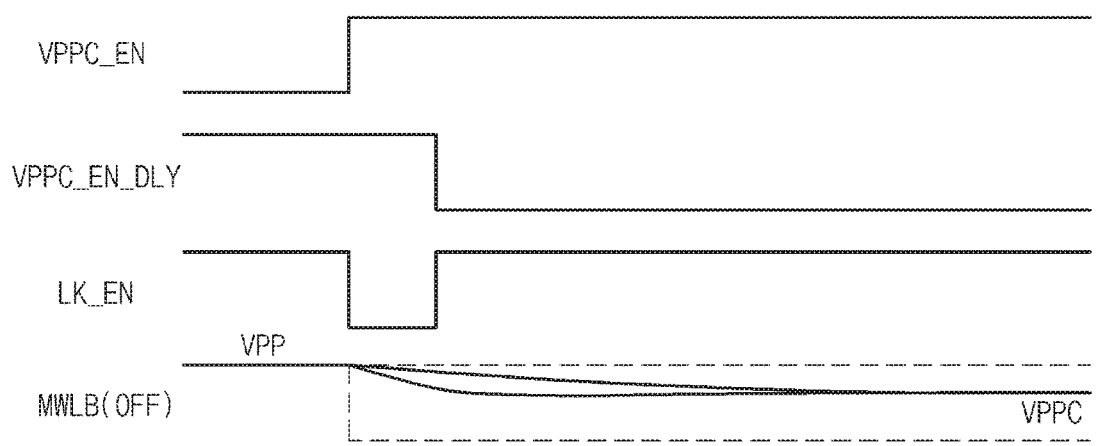
FIG. 4 is a timing chart illustrating signals of FIG. 3.

FIG. 4 is a timing chart illustrating the signals of FIG. 3.

Referring to FIG. 4, the driving voltage select signal VPPC_EN may be activated at a certain time point. The driving voltage select signal delay signal VPPC_EN_DLY may be obtained by delaying the inverted signal of the driving voltage select signal VPPC_EN by a predetermined time.

The leaker enable signal LK_EN may be obtained by performing a NAND operation on the driving voltage select signal VPPC_EN and the driving voltage select signal delay signal VPPC_EN_DLY. Thus, the leaker enable signal LK_EN may be activated for a predetermined time from the point of time that the driving voltage select signal VPPC_EN is activated.

The activation of the leaker enable signal LK_EN may increase the speed at which the voltage level of the main word line signal MWLB decreases from the pumping voltage VPP to the internal voltage VPPC. That is, referring to FIG. 4, the voltage level of the main word line signal MWLB may quickly decrease to the internal voltage VPPC.

Figure 5:
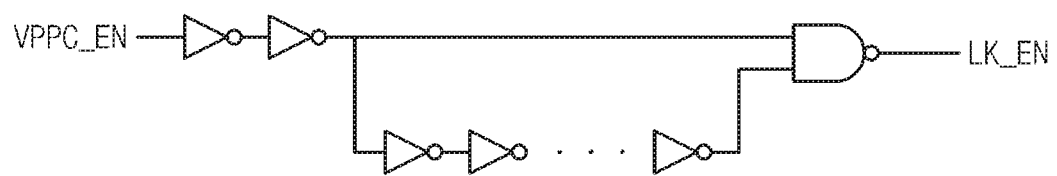
FIG. 5 illustrates a circuit for generating a leaker enable signal of FIG. 3.

FIG. 5 illustrates a circuit for generating the leaker enable signal LK_EN.

As described above, the leaker enable signal LK_EN may be activated for a predetermined time from the point of time that the driving voltage select signal VPPC_EN is activated. Referring to FIG. 5, the leaker enable signal LK_EN may be generated through the circuit which performs a NAND operation on a signal obtained by passing the driving voltage select signal VPPC_EN through two (or even number of) inverters and a signal obtained by passing the driving voltage select signal VPPC_EN through an odd number of inverters. The signal obtained by passing the driving voltage select signal VPPC_EN through an odd number of inverters may indicate a signal obtained by delaying the inverted signal of the driving voltage select signal by a predetermined time, that is, the driving voltage select signal delay signal VPPC_EN_DLY. Referring to FIG. 5, the circuit may include an odd number of inverters at the bottom thereof, which is larger than the number of inverters at the top thereof.

Referring back to FIG. 3, the sub word line driver S may include a PMOS transistor P4, an NMOS transistor N4 and an NMOS transistor N5.

The PMOS transistor P4 and the NMOS transistor N4 may be coupled in series to each other. The PMOS transistor P4 and the NMOS transistor N4 may receive the main word line signal MWLB through the gates thereof in common. The drain of the PMOS transistor P4 and the drain of the NMOS transistor N4 may be coupled to each other, and coupled to the sub word line SWL. The PMOS transistor P4 may receive an inverted sub word line driving signal FX through the source thereof, the inverted sub word line driving signal FX being an inverted signal of the sub word line driving signal FXB. The NMOS transistor N4 may receive the back bias voltage VBBW through the source thereof.

The NMOS transistor N5 may have the drain coupled to the common drain of the PMOS transistor P4 and the NMOS transistor N4. The NMOS transistor N5 may receive the sub word line driving signal FXB generated by the word line decoder 20 of FIG. 2 through the gate thereof. The NMOS transistor N5 may receive the back bias voltage VBBW through the source thereof.

According to such a configuration, the sub word line driver S may enable the sub word line SWL which is selected by the main word line signal MWLB and the sub word line driving signal FXB.

For example, when the main word line signal MWLB is at a low level, the PMOS transistor P4 may be pull-up driven. At this time, when the sub word line driving signal FXB is at a low level, the NMOS transistor N5 may be turned off. Then, the inverted sub word line driving signal FX, that is, a high-level voltage may be outputted to the sub word line SWL.

When any one of the main word line signal MWLB and the sub word line driving signal FXB is at a high level, a low-level voltage may be outputted to the sub word line SWL by the NMOS transistor N4 or N5.

Referring to FIG. 2, the semiconductor device including the main word line drivers M and the sub word line drivers S may decode a plurality of upper bits in the input address AX having the plurality of bits, and select (enable) any one of the plurality of main word line driving signals MWL. Furthermore, the semiconductor device may decode the lower bits excluding the upper bits in the input address AX, and select (enable) any one of the plurality of sub word line driving signals FXB. Thus, any one of the plurality of sub word line SWL in FIG. 2 may be selected (enabled).

The semiconductor device according to the present embodiments may provide the leaker unit 300 serving as a charge or current path, while performing an operation of lowering the voltage level of the output terminal of the main word line driver M of the word line driving circuit, that is, the main word line signal line MWLB. Therefore, while the voltage level of the main word line signal line MWLB quickly drops, the operation speed of the semiconductor device may be increased.

The embodiments of the present invention have been described. The present embodiments are not limited to the above-described embodiments and the accompanying drawings, but it is obvious to those skilled in the art that the present embodiments include various substitutions and modifications without departing the scope of the descriptions.

For reference, an embodiment including additional components may be provided. Furthermore, an active high or active low configuration indicating an active state of a signal or circuit may be changed depending on embodiments. Furthermore, the configuration of a transistor required for implementing the same function may be modified. That is, the configuration of the PMOS transistor and the configuration of the NMOS transistor may be replaced with each other, depending on a specific situation. If necessary, various transistors may be applied to implement the configurations.

For example, the PMOS transistor P3 of the leaker unit 300 in FIG. 3 may be replaced with an NMOS transistor. In this case, the leaker enable signal LK_EN may be generated by performing an XOR operation on the driving voltage select signal VPPC_EN and a signal obtained by delaying the driving voltage select signal VPPC_EN by a predetermined time. Thus, the leaker enable signal LK_EN may be activated to a high level for a predetermined time from the point of time that the driving voltage select signal VPPC_EN is activated.

According to the present embodiments, the voltage applied to the sub word line driving circuit may be more rapidly deceased. Thus, since the magnitude of stress applied to the PMOS transistor included in the sub word line driving circuit can be reduced, the reliability of the semiconductor device can be improved.

Furthermore, the semiconductor device can increase the speed at which the voltage applied to the sub word line driving circuit is stabilized, thereby improving the operation speed of the semiconductor device.

Figure 6:
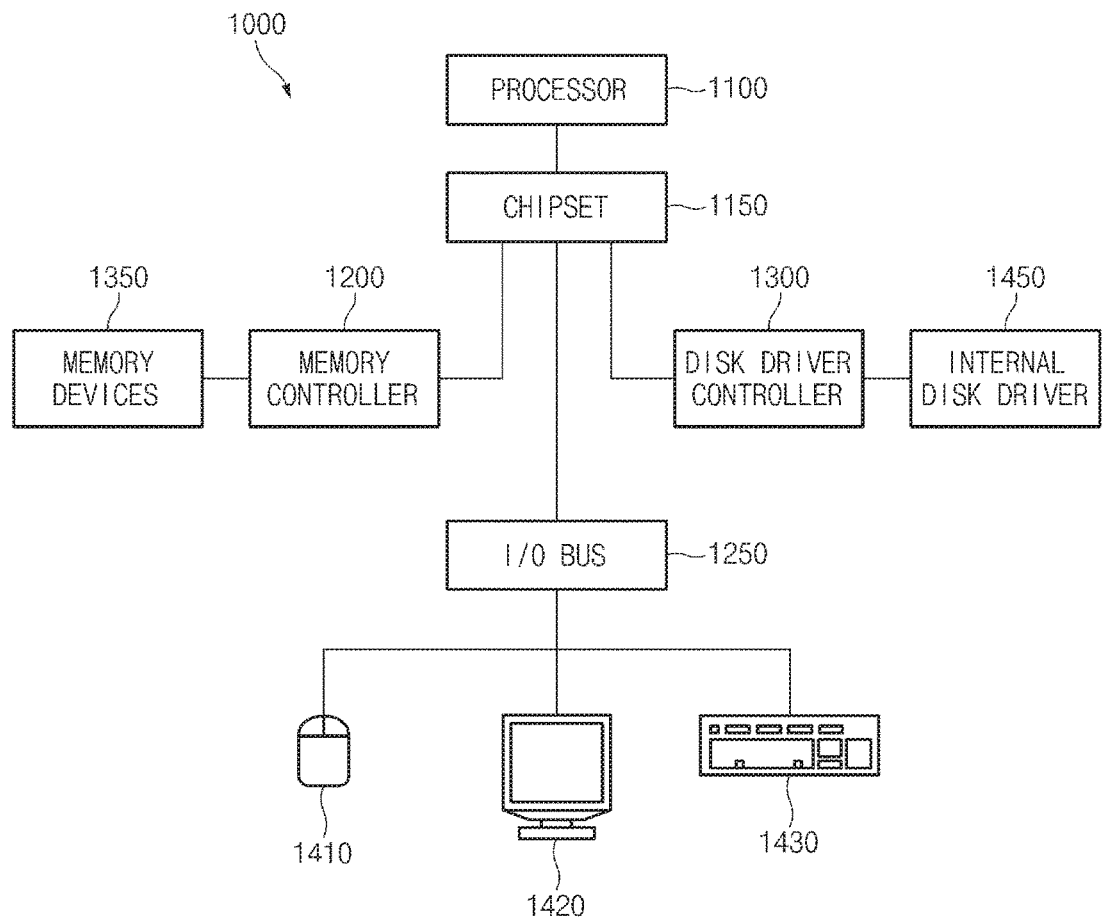
FIG. 6 illustrates a block diagram of an example of a representation of a system employing a semiconductor device and or current path control unit with the various embodiments discussed above with relation to FIGS. 2-5.

The semiconductor devices and or current path control units as discussed above (see FIGS. 2-5) are particular useful in the design of other memory devices, processors, and computer systems. For example, referring to FIG. 6, a block diagram of a system employing a semiconductor device and or current path control unit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and or current path control unit as discussed above with reference to FIGS. 2-5. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and or current path control unit as discussed above with relation to FIGS. 2-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 6 is merely one example of a semiconductor device and or current path control unit as discussed above with relation to FIGS. 2-5. In alternate embodiments, such as, for example but not limited to, cellular phones or digital cameras, the components may differ from the embodiments illustrated in FIG. 6.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A semiconductor device comprising:
    a driving voltage supply unit configured to selectively supply a first voltage or a second voltage lower than the first voltage, such that a main word line signal has a voltage level of the first voltage or the second voltage; and
    a current path control unit configured to provide a path of a current for increasing a speed at which the voltage level of the main word line signal decreases from the voltage level of the first voltage to the voltage level of the second voltage, based on a current path control signal,
    wherein the driving voltage supply unit is configured to supply the second voltage when a driving voltage select signal is activated, and
    wherein the current path control signal is activated for a predetermined time after the driving voltage select signal is activated.

2. The semiconductor device of claim 1, further comprising a main word line signal generation unit configured to selectively drive the main word line signal based on a main word line driving signal, wherein the driving voltage supply unit supplies the first or second voltage as a driving voltage of the main word line signal generation unit.

3. The semiconductor device of claim 1, wherein the current path control signal is activated for the predetermined time from a point of time that the driving voltage select signal is activated.

4. The semiconductor device of claim 1, wherein the current path control unit comprises a MOS transistor which is controlled according to the current path control signal.

5. The semiconductor device of claim 4,
wherein the MOS transistor comprises an NMOS transistor,
wherein the current path control signal is generated by performing an XOR operation on the driving voltage select signal and a signal obtained by delaying the driving voltage select signal by a predetermined time.

6. The semiconductor device of claim 5, wherein the current path control signal is activated to a high level for the predetermined time from a point of time that the driving voltage select signal is activated.

7. The semiconductor device of claim 4, wherein the MOS transistor comprises a PMOS transistor including a source of the PMOS transistor configured to receive the first or second voltage from the driving voltage supply unit, including a gate of the PMOS transistor configured to receive the current path control signal, and including a drain of the PMOS transistor configured to receive a supply voltage or a ground voltage.

8. The semiconductor device of claim 2, wherein the driving voltage select signal is activated when the main word line signal is at a low level, and decreases the voltage level of the main word line signal from the level of the first voltage to the level of the second voltage.

9. The semiconductor device of claim 1, wherein the driving voltage supply unit comprises an NMOS transistor configured to switch the driving voltage from the first voltage to the second voltage based on the driving voltage select signal.

10. The semiconductor device of claim 1,
wherein the driving voltage supply unit is configured to selectively supply the first or the second voltage based on the driving voltage select signal and a normal signal, and
wherein the normal signal and the driving voltage select signal have an inversion relation.

11. The semiconductor device of claim 1, wherein the current path control unit is coupled to an output terminal of the driving voltage supply unit.

12. The semiconductor device of claim 2, further comprising a sub word line driver configured to drive a sub word line based on the main word line signal and a sub word line driving signal.

13. The semiconductor device of claim 12, wherein the sub word line driver further comprises a PMOS transistor configured to receive the main word line signal through the gate thereof.

14. The semiconductor device of claim 13, wherein the driving voltage select signal is activated when the main word line signal is at a high level, and decreases the magnitude of a voltage applied to the gate of the PMOS transistor.

15. A semiconductor device comprises:
a main word line driver configured to generate a main word line signal by pull-up or pull-down driving a main word line driving signal, wherein the main word line driver comprises:
a driving voltage supply unit configured to selectively supply a first voltage or a second voltage as a driving voltage of the main word line driver, the second voltage being lower than the first voltage; and
a current path control unit coupled to an output terminal of the driving voltage supply unit, and configured to provide a path of a current based on a current path control signal,
wherein the current path control signal is activated for a predetermined time after the driving voltage is changed from the first voltage to the second voltage by the driving voltage supply unit, and
wherein the path of a current flowing to the current path control unit through the main word line driver from an output terminal of the main word line driver is formed based on the current path control signal,
wherein when the main word line driving signal is at a low level, the driving voltage supply unit changes the driving voltage from the first voltage to the second voltage, and decreases the voltage level of the main word line signal from the level of the first voltage to the level of the second voltage.

16. The semiconductor device of claim 15, wherein the current path control signal is activated for the predetermined time from a point that the driving voltage is changed from the first voltage to the second voltage by the driving voltage supply unit.

17. The semiconductor device of claim 15, further comprising a sub word line driver configured to drive a sub word line based on the main word line signal and a sub word line driving signal, and comprising a PMOS transistor configured to receive the main word line signal through the gate thereof,
wherein the semiconductor device increases the speed at which the magnitude of a voltage applied to the gate of the PMOS transistor decreases.

18. The semiconductor device of claim 15, further comprising a main word line signal generation unit configured to generate the main word line signal by pull-up or pull-down driving the main word line driving signal,
wherein the driving voltage supply unit supplies the first voltage or the second voltage as a pull-up driving voltage of the main word line signal generation unit.

19. The semiconductor device of claim 18, wherein the current path control unit is coupled to a pull-up driving voltage supply terminal of the driving voltage supply unit.

* * * * *